United States Patent
Chang et al.

(10) Patent No.: US 10,332,879 B2
(45) Date of Patent: *Jun. 25, 2019

(54) FIN-TYPE FIELD EFFECT TRANSISTOR STRUCTURE AND MANUFACTURING METHOD THEREOF

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/706,764

(22) Filed: Sep. 18, 2017

(65) Prior Publication Data

US 2018/0019240 A1 Jan. 18, 2018

Related U.S. Application Data

(63) Continuation of application No. 14/968,917, filed on Dec. 15, 2015, now Pat. No. 9,768,168.

(51) Int. Cl.
| | |
|---|---|
| *H01L 27/088* | (2006.01) |
| *H01L 21/8234* | (2006.01) |
| *H01L 29/49* | (2006.01) |
| *H01L 29/66* | (2006.01) |
| *H01L 29/78* | (2006.01) |

(52) U.S. Cl.
CPC .. *H01L 27/0886* (2013.01); *H01L 21/823431* (2013.01); *H01L 21/823437* (2013.01); *H01L 21/823462* (2013.01); *H01L 21/823468* (2013.01); *H01L 29/495* (2013.01); *H01L 29/4966* (2013.01); *H01L 29/66795* (2013.01); *H01L 29/785* (2013.01)

(58) Field of Classification Search
CPC combination set(s) only.
See application file for complete search history.

(56) References Cited

U.S. PATENT DOCUMENTS

| | | | |
|---|---|---|---|
| 7,326,656 B2* | 2/2008 | Brask | H01L 21/845 257/E21.442 |
| 2011/0193141 A1* | 8/2011 | Lin | H01L 29/045 257/255 |

* cited by examiner

*Primary Examiner* — Matthew L Reames
(74) *Attorney, Agent, or Firm* — JCIPRNET (57) ABSTRACT

A fin-type field effect transistor comprising a substrate, at least one gate structure, spacers and source and drain regions is described. The substrate has a plurality of fins and a plurality of insulators disposed between the fins. The source and drain regions are disposed on two opposite sides of the at least one gate structure. The gate structure is disposed over the plurality of fins and disposed on the plurality of insulators. The gate structure includes a stacked strip disposed on the substrate and a gate electrode stack disposed on the stacked strip. The spacers are disposed on opposite sidewalls of the gate structure, and the gate electrode stack contacts sidewalls of the opposite spacers.

20 Claims, 8 Drawing Sheets

FIN-TYPE FIELD EFFECT TRANSISTOR STRUCTURE AND MANUFACTURING METHOD THEREOF

CROSS-REFERENCE

This application is a continuation application of and claims the priority benefit of U.S. patent application Ser. No. 14/968,917, filed on Dec. 15, 2015, now allowed. The entirety of the above-mentioned patent applications is hereby incorporated by reference herein and made a part of this specification.

BACKGROUND

Three-dimensional multi-gate structures, such as the fin-type field effect transistors (FinFETs), have been actively developed following the trend of scaling down the size of the semiconductor devices. The narrow strip(s) of semiconductor material fin of the FinFET is used to form source/drain and channel regions of the transistor, and the gate structure wrapping around the channel region further provides better electrical control over the channel. While the size of the semiconductor device keeps decreasing, the fin arrangement becomes tightened and the gate pitch is reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of FinFETs and the FinFETs fabricated there-from. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are intended to provide further explanations but are not used to limit the scope of the present disclosure.

Figure 1:
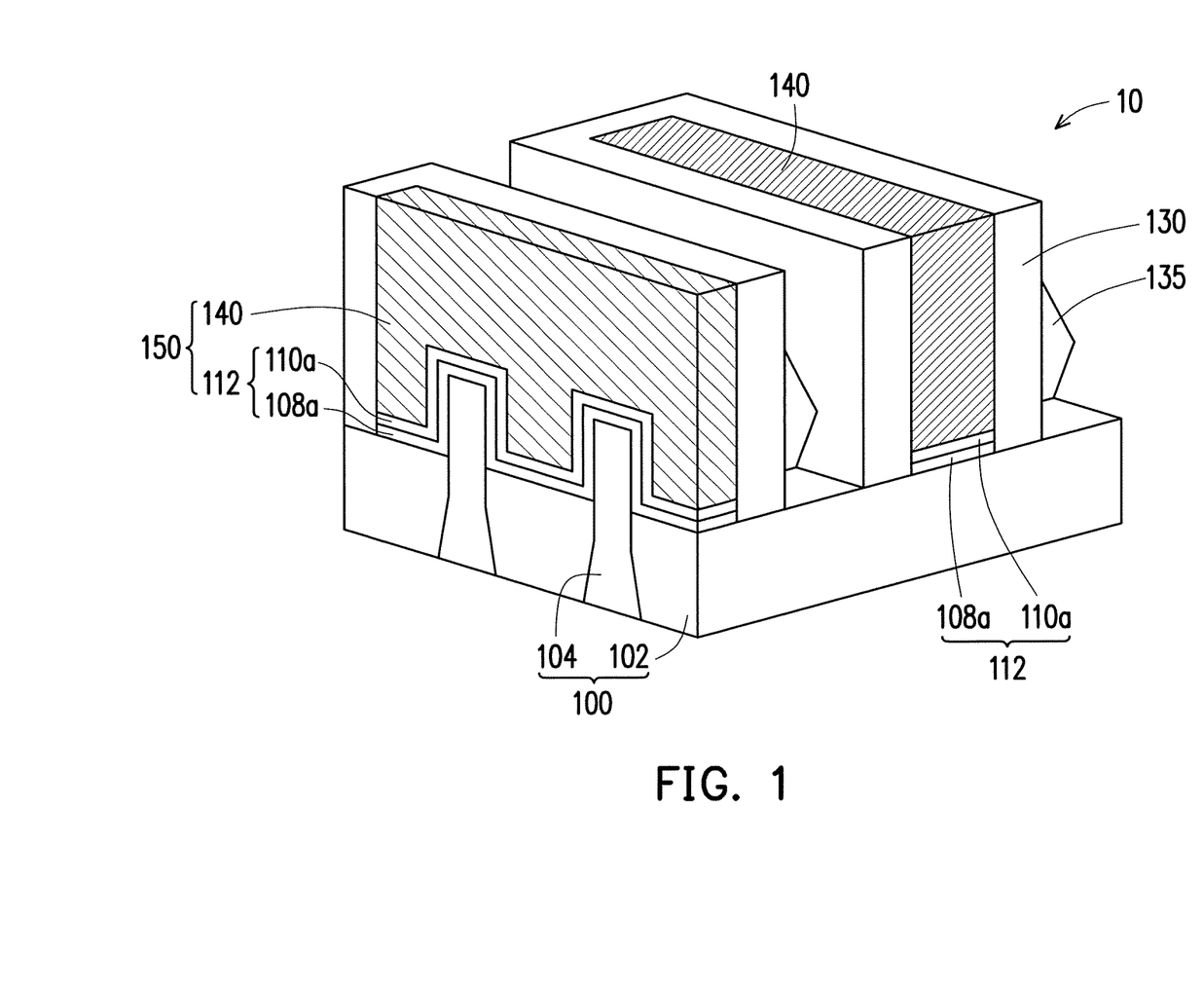
FIG. 1 is a perspective view of a portion of an exemplary FinFET device in accordance with some embodiments of the present disclosure.

FIG. 1 illustrates a perspective view of a portion of an exemplary FinFET device in accordance with some embodiments of the present disclosure. In FIG. 1, the FinFET device 10 comprises at least one gate structure 150 formed on a substrate 100, spacers 120 formed on opposite sides of the gate structure 150, and source and drain regions 135 located at two opposite sides of the gate structure 150. In some embodiments, the FinFET device 10 is a p-type FinFET device. In some embodiments, the FinFET device 10 is an n-type FinFET device. In certain embodiments, the substrate 100 includes insulators 102 and fins 104 located between the insulators, and the extending direction of the gate structure 150 is perpendicular to the extending direction of the fin 104. In some embodiments, the gate structure 150 includes a stacked strip 112 and a gate electrode stack 140 disposed on the stacked strip. In certain embodiments, the stacked strip 112 includes a high-k dielectric strip 108a and a work function metal material strip 110a. In some embodiments, the gate structure 150 is a replacement metal gate structure. In some embodiments, the source and drain regions 135 located beside the spacers 130 and the gate structure 150 are strained source and drain regions.

Figure 2A:
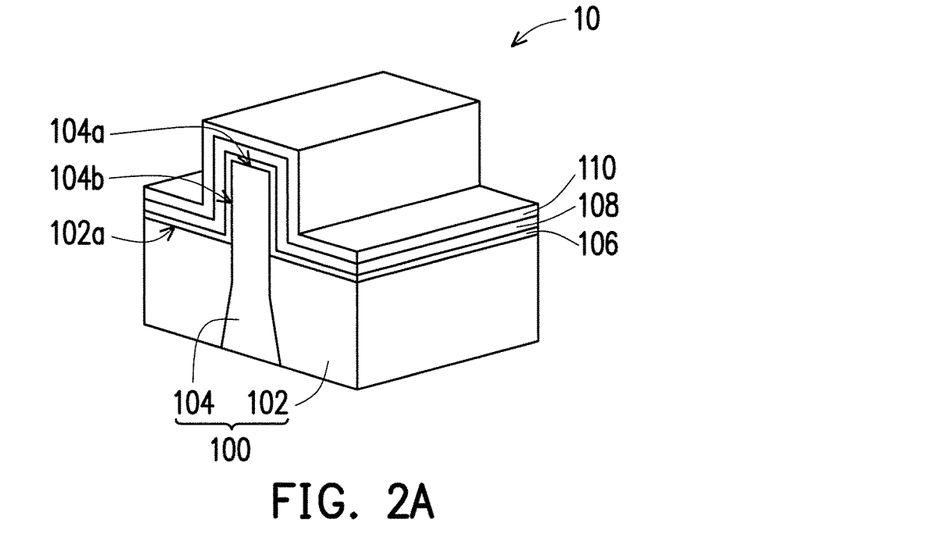
FIGS. 2A-2J and FIGS. 2E' and 2F' are the perspective views and cross-sectional views showing the FinFET at various stages of the manufacturing method for forming a FinFET according to some embodiments of the present disclosure.

FIGS. 2A-2J illustrate the perspective views and cross-sectional view of a portion of the FinFET device 10 at various stages of the manufacturing methods for forming a FinFET device according to some embodiments of the present disclosure. In FIG. 2A, a substrate 100 formed with insulators 102 and fins 104 is provided. In some embodiments, the substrate 100 is a bulk silicon substrate. Depending on the requirements of design, the bulk silicon substrate may be a p-type substrate or an n-type substrate and comprise different doped regions. The doped regions may be configured for an n-type FinFET or a p-type FinFET. In some embodiments, the substrate 100 is patterned to define the fins 104 by forming trenches (not shown) in the substrate 100 and then insulators 102 are filled within the trenches. In some embodiments, the fins 104 are narrow-strips arranged in parallel and the insulators 102 filled in the trenches are strip-shaped and arranged in parallel and between the fins 104 for isolation. In some embodiments, the material of the insulators 102 includes silicon oxide, silicon nitride, silicon oxynitride, a spin-on dielectric material, or a low-k dielectric material. The method of forming the insulators includes high-density-plasma chemical vapor deposition (HDP- CVD), sub-atmospheric CVD (SACVD) or spin-on, for example. In some embodiments, the top surfaces 102a of the insulators 102 are lower than the top surfaces 104a of the fins 104. That is, the fins 104 protrude from the top surfaces 102a of the insulators 102.

Thereafter, in FIG. 2A, in some embodiments, a high-k dielectric layer 108 and a work function metal material layer 110 are sequentially formed on the insulators 102 and the fins 104 and over the substrate 100. In some embodiments, after conformally forming the high-k dielectric layer 108 on the insulators 102 and the fins 104 and over the substrate 100, the work function metal material layer 110 is then formed on the high-k dielectric layer 108 conformal to and over the insulators 102 and the fins 104. In some embodiments, the high-k dielectric layer 108 includes a high-k dielectric material, and the high-k dielectric material has a k value greater than about 7.0 and includes a metal oxide or a silicate of hafnium (Hf), Al, zirconium (Zr), lanthanum (La), magnesium (Mg), barium (Ba), titanium (Ti), lead (Pb) and combinations thereof. For example, the high-k dielectric layer 108 is formed by atomic layer deposition (ALD), molecular beam deposition (MBD) or physical vapor deposition (PVD). In certain embodiments, the material of the work function metal material layer 110 includes TiN, TaC, TaCNO, TaCN, TiAl, TaN or the combinations thereof. The method of forming the work function metal material layer 110 includes performing an ALD process, a CVD process or a physical chemical vapor (PVD) process, for example. In one embodiment, the high-k dielectric layer 108 includes $HfO_2$ and the work function metal material layer 110 includes TiN. The material of the work function metal material layer 110 is chosen to have a desired work function value depending on the requirements of the product, and is not limited by the above-mentioned materials. In certain embodiments, an insulation material layer 106 is optionally formed, conformally covering the substrate 100 before the step of forming the high-k dielectric layer 108, so as to increase the adhesion between the high-k dielectric layer 108 and the substrate 100. The insulation material layer 106 includes silicon oxide formed by thermal oxidation, for example. In some embodiments, the insulation material layer 106, the high-k dielectric layer 108 and the work function metal material layer 110 conformally cover the fins 104 and covers the top surfaces 104a of the fins 104 and sidewalls 104b of the protruded portions of the fins 104.

Figure 2B:
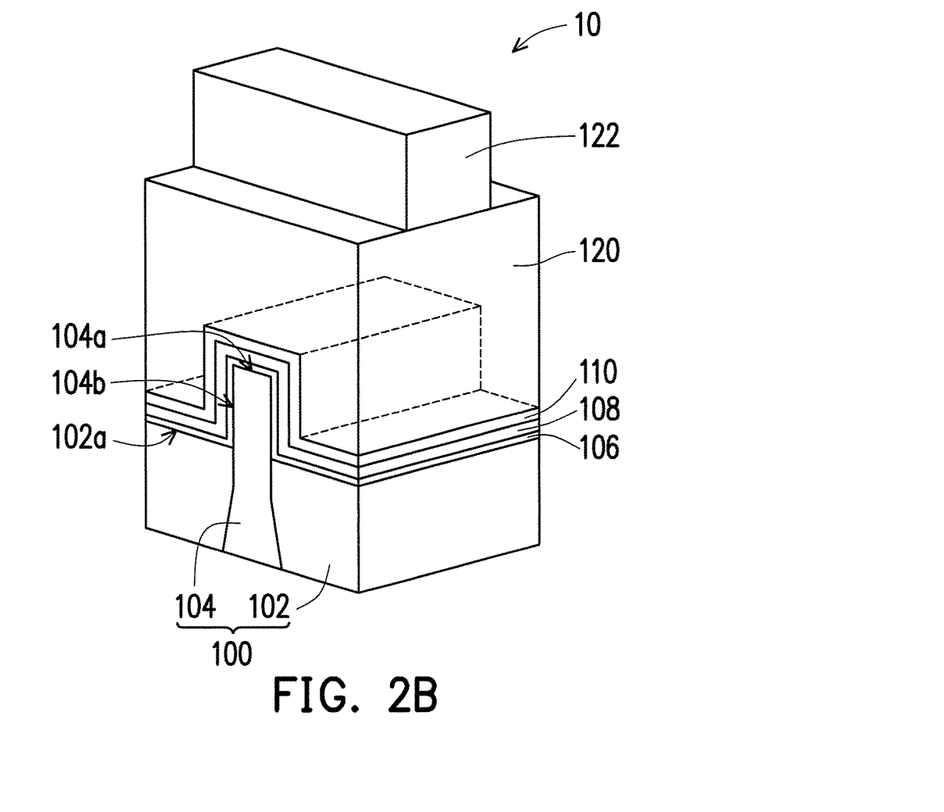

In FIG. 2B, in some embodiments, a polysilicon layer 120 and a hard mask pattern 122 are sequentially formed on the work function metal material layer 110. In certain embodiments, the hard mask pattern 122 includes one or more strip patterns arranged in parallel, for example. The method of forming the polysilicon layer 120 includes performing a CVD process, for example. In one embodiment, the material of the hard mask pattern 122 includes silicon oxide, silicon nitride or silicon oxynitride. The method of forming the hard mask pattern 122 includes performing a CVD process or a PVD process, for example.

Figure 2C:
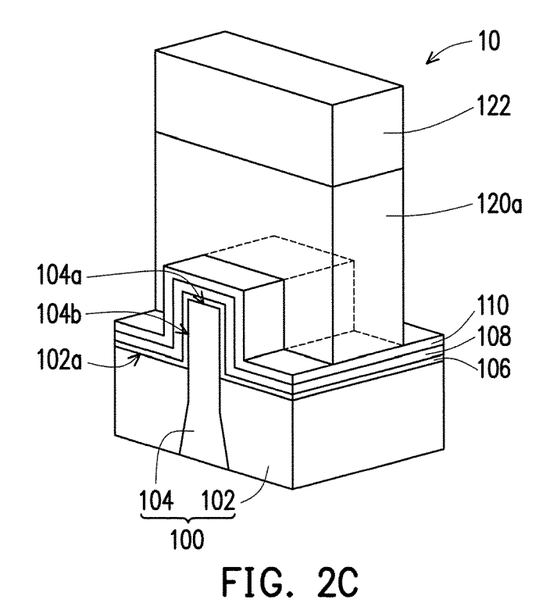

Referring to FIG. 2C, in some embodiments, the polysilicon layer 120 is patterned to form polysilicon strips 120a by using the hard mask pattern 122 as a mask, and the underlying the work function metal material layer 110 is partially exposed. In certain embodiments, as the hard mask pattern 122 includes a number of strip patterns arranged in parallel, the polysilicon layer 120 is patterned to include a number of polysilicon strips 120a arranged in parallel. The patterning of the polysilicon layer 120 includes performing at least one anisotropic etching process, for example. In certain embodiments, the polysilicon strips 120a functions as dummy strips, which defines the locations of the subsequently formed replacement gate structures.

Figure 2D:
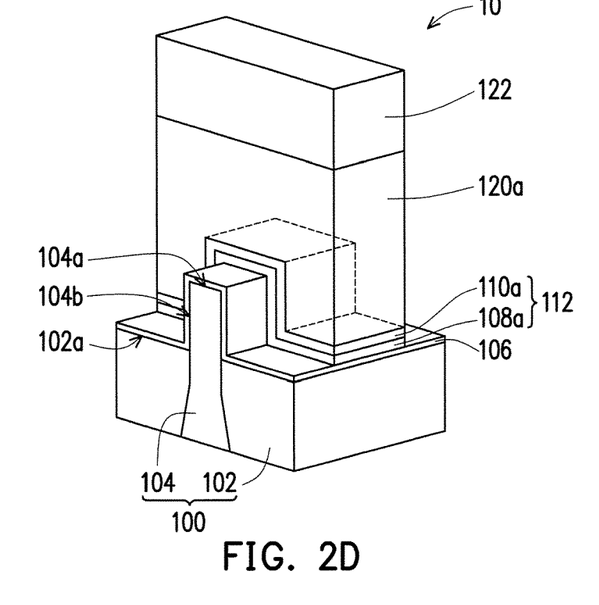

In FIG. 2D, in some embodiments, using the polysilicon strips 120a and the hard mask pattern 122 as masks, the underlying work function metal material layer 110 and high-k dielectric layer 108 are sequentially patterned to form the work function metal material strips 110a and high-k dielectric strips 108a. One of the high-k dielectric strips 108a and one of the work function metal material strips 110a disposed on the respective high-k dielectric strip 108a form one stacked strip 112. The work function metal material strips 110a and high-k dielectric strips 108a wrap around the fins 104 and cover the top surfaces 104a and the sidewalls 104b of the fins 104. In certain embodiments, as the hard mask pattern 122 includes several separate strip patterns arranged in parallel, the underlying work function metal material layer 110 and high-k dielectric layer 108 after patterning turn into the stacked strips 112 (the high-k dielectric strips 108a and the work function metal material strips 110a respectively disposed on the high-k dielectric strips 108a), and the stacked strips 112 are separate from one another and arranged in parallel. The patterning of the work function metal material layer 110 and high-k dielectric layer 108 includes performing one or more anisotropic etching processes, for example. In one embodiment, the insulation material layer 106 is partially exposed after patterning the work function metal material layer 110 and high-k dielectric layer 108.

Figure 2E:
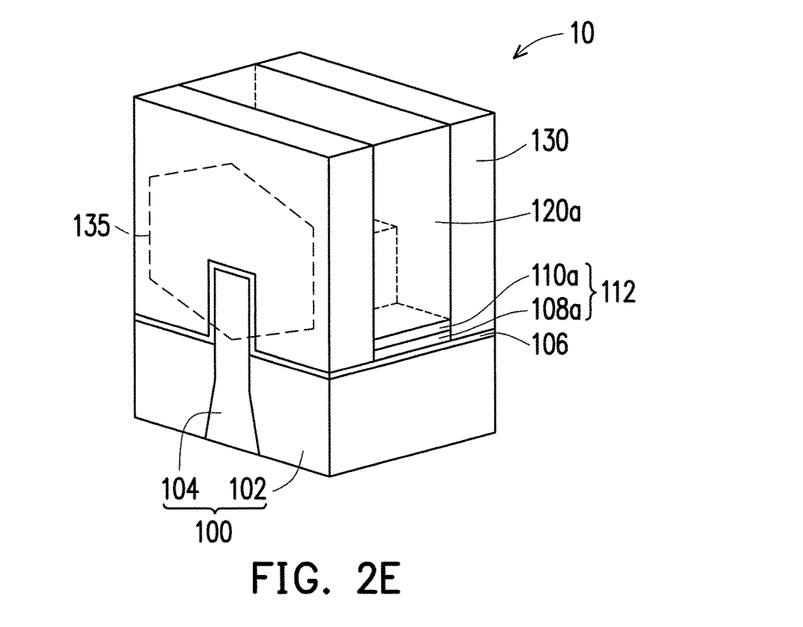

Then, in FIG. 2E, in some embodiments, the hard mask pattern 122 is removed and the spacers 130 are formed on the insulation material layer 106 and beside the polysilicon strips 120a and the stacked strips 112 (the high-k dielectric strips 108a and the work function metal material strips 110a). In certain embodiments, the spacers 130 are formed on the insulation material layer 103 and on opposite sidewalls of the polysilicon strips 120a. That is, the spacers 130 are disposed on opposite sidewalls of the polysilicon strips 120a and the stacked strips 112 beneath the polysilicon strips 120a are sandwiched between the spacers 130. In one embodiment, the spacers 130 is formed of a dielectric material that includes silicon nitride, SiCON or the combination thereof. The spacers 130 may be a single layer or a multilayered structure. In some embodiments, the spacers 130 are formed by depositing a blanket layer of a dielectric material (not shown) and performing an anisotropic etching process and/or a planarization process to remove the extra dielectric material and the hard mask pattern 122 so as to form the spacers 130 on the sidewalls of the polysilicon strips 120a and beside the stacked strips 112. The hard mask pattern 122 is removed before or along with the formation of spacers 130.

FIG. 2E and FIG. 2E' illustrate the perspective views of a non-line-end portion and a line-end portion of the FinFET device 10 respectively according to some embodiments of the present disclosure. In some embodiments, as shown in FIG. 2E and FIG. 2E', after forming the spacers 130 on the sidewalls of the polysilicon strips 120a and beside the stacked strips 112, the source and drain regions 135 are formed at opposite sides of the spacers 130 located on the polysilicon strips 120a. Also, an inter-dielectric layer 136 (FIG. 2I) is formed over the substrate 100 for further isolation. In certain embodiments, the source and drain regions 135 are strained source and drain regions formed of a strained material. In some embodiments, the strained material is a germanium-containing material, such a silicon germanium (SiGe) or a carbon-containing material such as silicon carbide (SiC). In some embodiments, the source and drain regions 135 are formed through epitaxial growth technology, such as cyclic deposition-etch (CDE) epitaxy or selective epitaxial growth (SEG), to form the strained material of high crystal quality. In certain embodiments, some of the source and drain regions 135 are protruded from the substrate 100. In some embodiments, the source and drain regions 135 are optionally formed with silicide layers (not shown) by silicidation. In certain embodiments, the material of the inter-dielectric layer 136 includes carbon-containing oxides, silicate glass, or other dielectric materials.

Figure 2F:
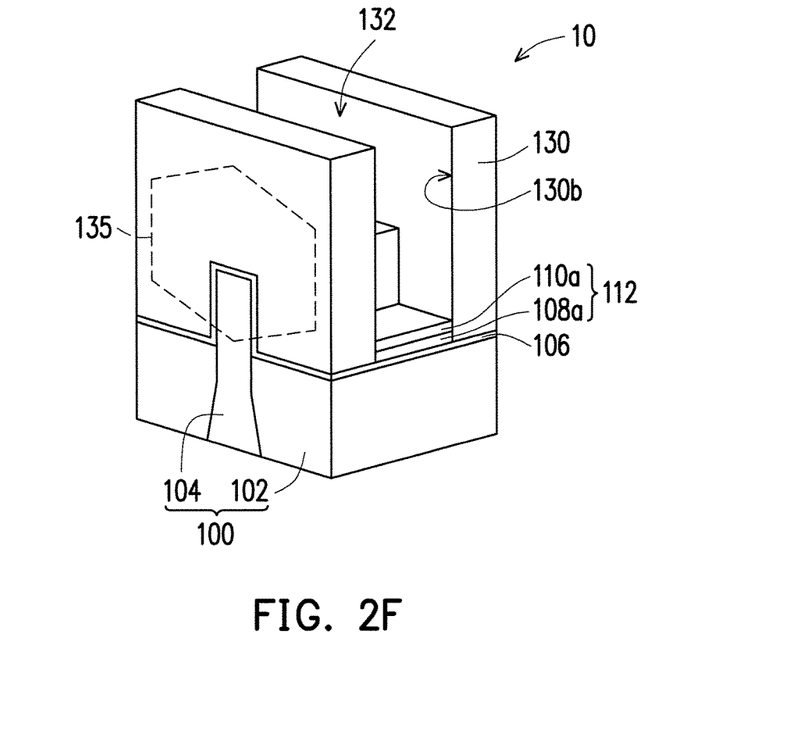

FIG. 2F and FIG. 2F' illustrate the perspective views of a non-line-end portion and a line-end portion of the FinFET device 10 respectively according to some embodiments of the present disclosure. In FIG. 2F and FIG. 2F', the polysilicon strips 120a are removed and recesses 132 between opposite spacers 130 are formed to expose the stacked strips 112 (the high-k dielectric strips 108a and the work function metal material strips 110a) between the spacers 130. The removal of the polysilicon strips 120 includes performing one or more anisotropic etching processes, for example.

Figure 2G:
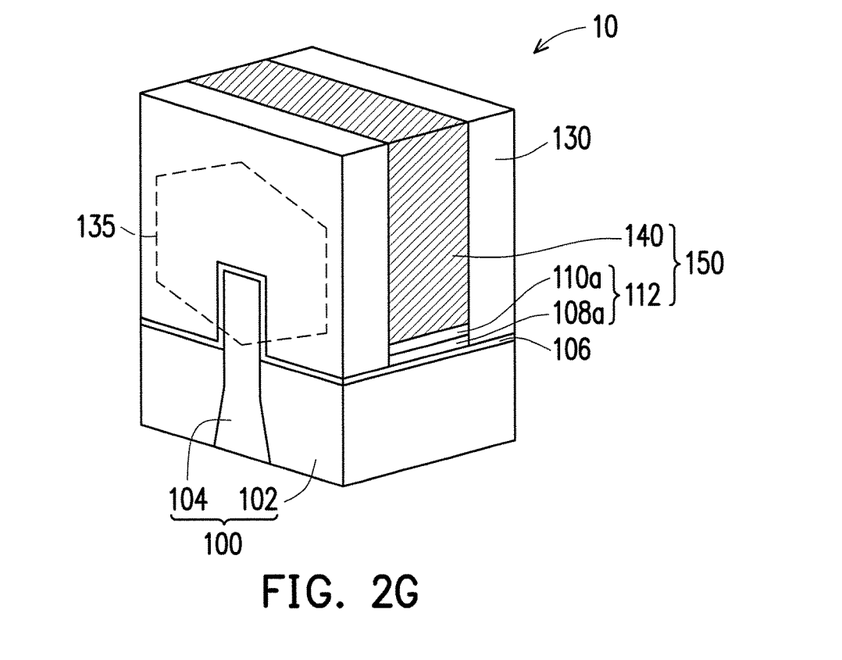
Figure 2H:
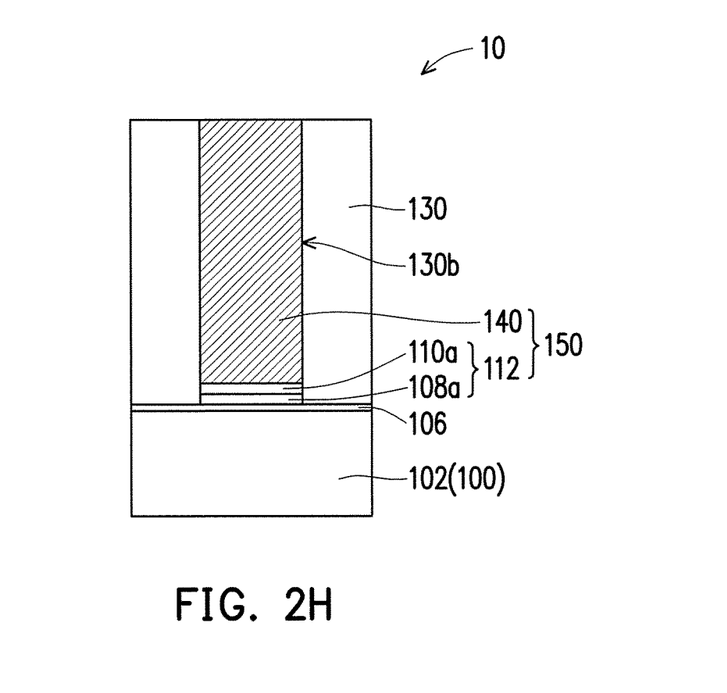
Figure 2I:
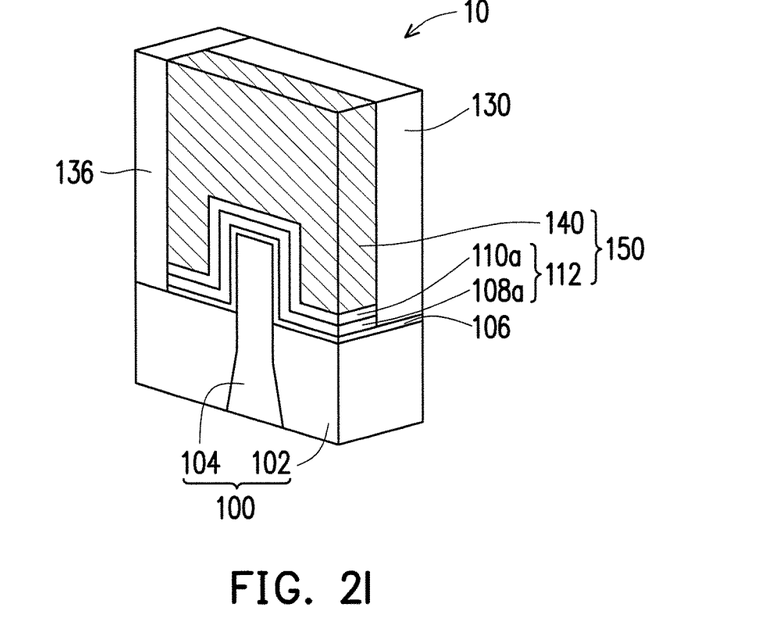
Figure 2J:
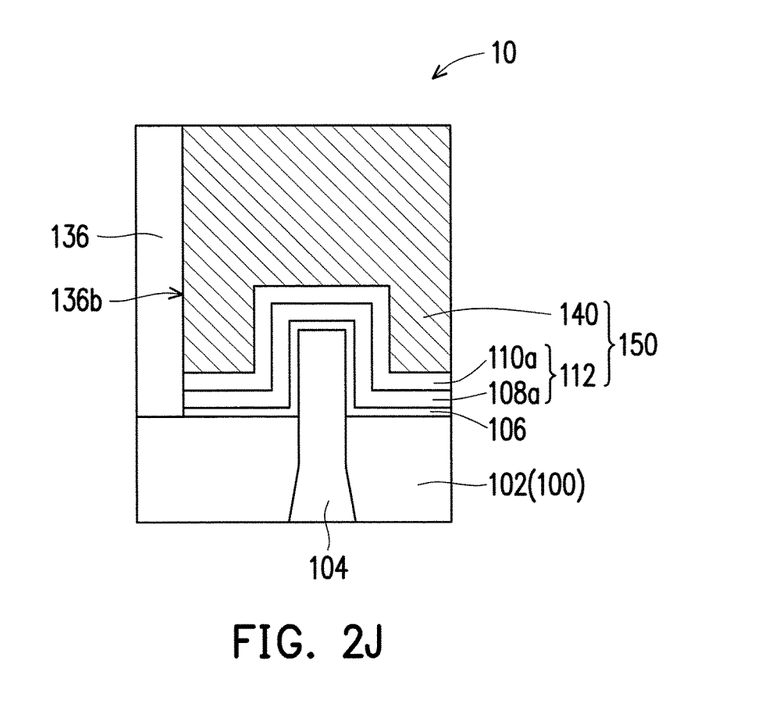

FIG. 2G and FIG. 2I illustrate the perspective views of a non-line-end portion and a line-end portion of the FinFET device 10 respectively according to some embodiments of the present disclosure. FIG. 2H & FIG. 2J are exemplary cross-sectional views of FIG. 2G and FIG. 2I. The line-end portion refers to the portion of the FinFET device 10 including the end portion of the strip shaped gate structure (i.e. gate line). In some embodiments, as shown in FIGS. 2G-2H, gate electrode stacks 140 are formed within the recesses 132 and on the stacked strips 112 (the high-k dielectric strips 108a and the work function metal material strips 110a) between the spacers 130 to form gate structures 150. In certain embodiments, the gate structure 150 is composed of the gate electrode stack 140, the high-k dielectric strip 108a and the work function metal material strip 110a. In one embodiment, the gate electrode stacks 140 are formed by forming a gate electrode material (not shown) to fill the recesses 132 between the spacers 130. Optionally, a planarization process is performed to remove the excess gate electrode material. As shown in FIGS. 2G-2J, in certain embodiments, the gate electrode stack 140 filled within the recess 132 is conformal to the profile of the recess 132, and the gate electrode stack 140 covers the sidewalls 130b of the spacers 130 and the sidewall 136b of the inter-dielectric layer 136 at the line-end. That is, the gate electrode stack 140 filled within the recess 132 physically contacts the sidewalls 130b of the spacers 130 and the sidewall 136b of the inter-dielectric layer 136 at the line-end of the gate structure 150. As the high-k dielectric strips 108a and the work function metal material strips 110a are defined before forming the spacers 130 and the inter-dielectric layer 136, the high-k dielectric strips 108a and the work function metal material strips 110a will not conformally cover the sidewalls 130b of the spacers 130 and the sidewall 136b of the inter-dielectric layer 136. In certain embodiments, the sidewalls 130b of the spacers 130 and the sidewall 136b of the inter-dielectric layer 136 are mostly free from being covered by the high-k dielectric strips 108a and the work function metal material strips 110a, except a small portion alongside the stacked strips 112. Because the high-k dielectric strips 108a and the work function metal material strips 110a are formed before the formation of the spacers 130 and the subsequent recesses 132, the filling of the gate electrode material becomes easier and the process window for forming the gate electrode stack is enlarged. In certain embodiments, as shown in FIG. 2H, the strip-shaped work function metal material strips 110a and high-k dielectric strips 108a are extensively located beneath the gate electrode stacks 140. In some embodiments, the gate electrode stack 140 physically contacts the spacers 130 and the inter-dielectric layer 136, without the high-k dielectric layer and/or the work function metal material layer located there-between. The gate electrode stacks 140 and the beneath stacked strips 112 (the high-k dielectric strips 108a and the work function metal material strips 110a) rest across and wrap around the fins 104 (the channel regions). Optionally, a sidewall dielectric layer (not shown), such as a silicon nitride layer, is formed between the spacers 130 and the gate electrode stacks 140 before forming the gate electrode material to reinforce the spacer structures.

In some embodiments, the gate electrode material of the gate electrode stacks 140 comprises a metal-containing material, such as aluminum (Al), copper (Cu), tungsten (W), cobalt (Co), titanium (Ti), tantalum (Ta), ruthenium (Ru), TiN, TiAl, TiAlN, TaN, TaC, NiSi, CoSi or a combination thereof. For example, the gate electrode material is formed by ALD, CVD, PVD, plating, or combinations thereof. Depending on whether the FinFET 20 is a p-type FinFET or an n-type FinFET, the materials of the high-k dielectric layer, the work function metal material layer and/or the gate electrode stacks are chosen for optimized work function. In certain embodiments, the dummy polysilicon strips 120a are removed and the gate electrode stacks 140 take the place of the polysilicon strips 120a and are disposed on the previously formed stacked strips 112 so as to form the replacement gate structures 150. Although the gate structures 150 are replacement gates in some embodiments described herein, the gate stack structures or the fabrication processes thereof are not limited by these embodiments.

In some embodiments described herein, because the gate dielectric layer and/or other material layers are formed before the formation of spacers, there is no need to deposit gate dielectric layer and/or other material layers conformal to the recess (i.e. covering the sidewalls of the spacers) before filling the gate electrode material into the recess and the later formed gate electrode stack can contact with the sidewalls of the spacers and/or the inter-dielectric layer.

For the FinFET with a narrow gate pitch or dense fin arrangements, the filling of the gate electrode material and/or the work function metal material becomes challenging due to the higher aspect ratio and reduced chip area. In certain embodiments described herein, the high-k dielectric layer and the work function metal material layer are formed and patterned before forming the spacers, the process window of forming the high-k dielectric layer and the work function metal material layer becomes larger, when compared with the layer(s) filling into the recess between the spacers. Also, it is easier to control the thickness and uniformity of the high-k dielectric layer and the work function metal material layer following the manufacturing method described in certain embodiments of the present disclosure. Better uniformity and small thickness variations of the high-k dielectric layer and the work function metal material layer improve the reliability of the semiconductor devices and contribute to the control of the threshold voltage of the device. Because the high-k dielectric layer and the work function metal material layer are formed and patterned before the formation of the spacers and the recesses, the filling of the gate electrode material into the recess becomes less demanding, the filling process window of the gate electrode material becomes larger and the subsequently formed gate electrode stacks in the recesses are more uniform, leading to the semiconductor devices of a well-controlled threshold voltage.

Figure 3:
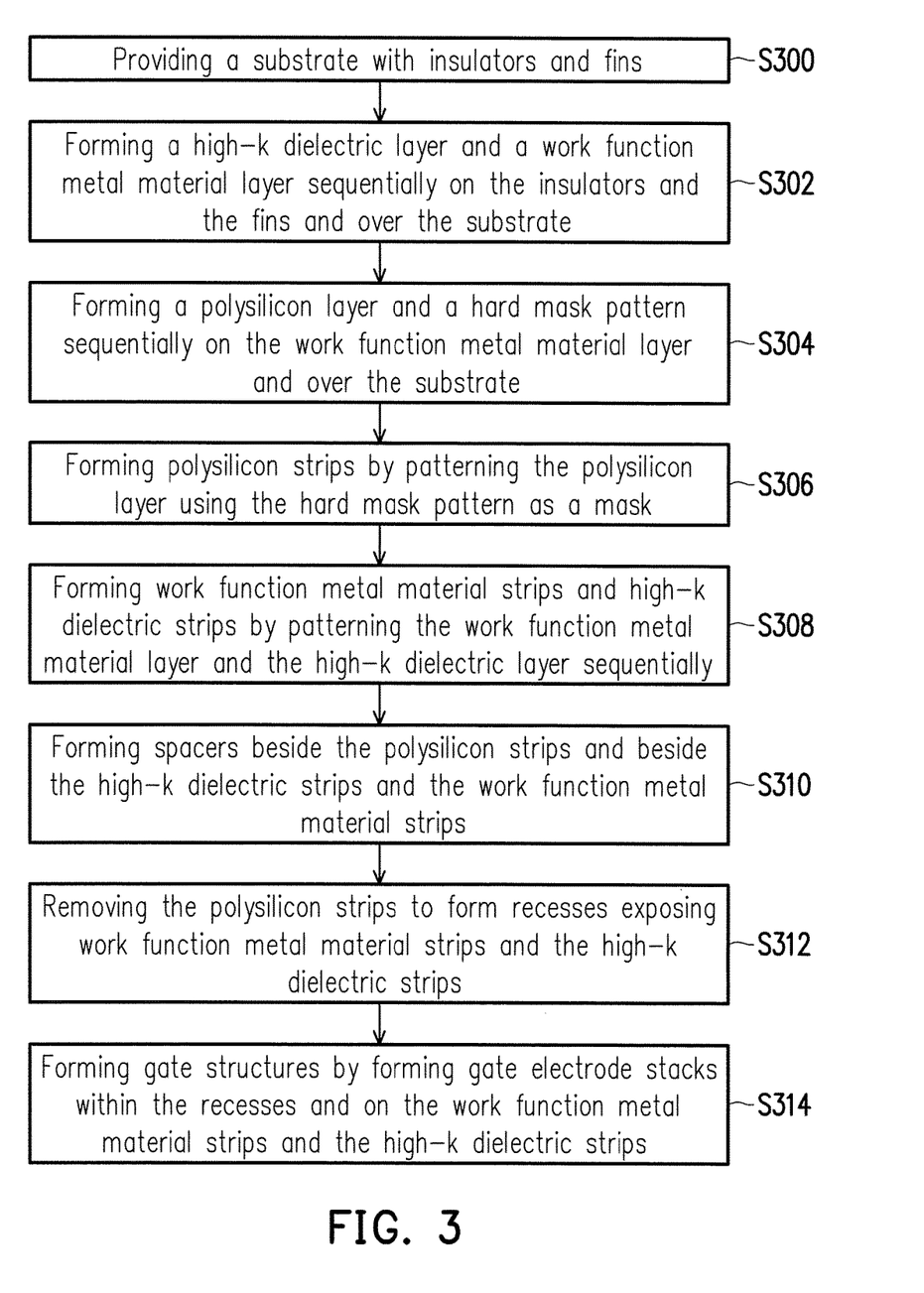
FIG. 3 is an exemplary flow chart showing the process steps of the manufacturing method for forming a FinFET in accordance with some embodiments of the present disclosure.

FIG. 3 is an exemplary flow chart showing some of the process steps of the manufacturing method for forming a FinFET in accordance with some embodiments of the present disclosure. In Step 300, a substrate with insulators and fins is provided. In Step 302, a high-k dielectric layer and a work function metal material layer are sequentially formed on the insulators and the fins and over the substrate. In Step 304, a polysilicon layer and a hard mask pattern are sequentially formed on the work function metal material layer and over the substrate. In Step 306, polysilicon strips are formed by patterning the polysilicon layer using the hard mask pattern as a mask. In Step 308, work function metal material strips and high-k dielectric strips are formed by patterning the high-k dielectric layer and the work function metal material layer sequentially using the polysilicon strips and the hard mask pattern as masks. In Step 310, spacers are formed beside the polysilicon strips and beside the high-k dielectric strips and the work function metal material strips. The source and drain regions are formed at opposite sides of the spacers located on the sidewalls of the polysilicon strips. In Step 312, the polysilicon strips are removed and recesses between the opposite spacers are formed to expose the high-k dielectric strips and the work function metal material strips. In Step 314, gate structures are obtained by forming gate electrode stacks within the recesses and on the high-k dielectric strips and the work function metal material strips.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the above embodiments, as the high-k dielectric layer and the work function metal material layer are formed over the fins and patterned before the formation of the spacers, the thickness and uniformity of the high-k dielectric layer and the work function metal material layer are well-controlled and the filling of the gate electrode material into the recess is improved and kept stable, thus leading to uniform electrical performance and better reliability of the semiconductor device. Accordingly, the wafer analysis test (WAT) results and the uniformity performance of the device can be enhanced.

In some embodiments of the present disclosure, a fin-type field effect transistor comprising a substrate, at least one gate structure, spacers and source and drain regions is described. The substrate has a plurality of fins and a plurality of insulators disposed between the plurality of fins. The at least one gate structure is disposed over the plurality of fins and disposed on the plurality of insulators. The at least one gate structure includes a stacked strip disposed on the substrate and a gate electrode stack disposed on the stacked strip. The spacers are disposed on opposite sidewalls of the at least one gate structure, and the gate electrode stack contacts with sidewalls of the opposite spacers. The source and drain regions are disposed on two opposite sides of the at least one gate structure.

In some embodiments of the present disclosure, a method for forming a fin-type field effect transistor is described. A substrate with fins and insulators located between the fins is provided. Stacked strips are formed on the substrate and wrap over the fins and polysilicon strips are formed on the stacked strips and over the substrate. Spacers are formed beside the polysilicon strips and beside the stacked strips. The polysilicon strips are removed to form recesses exposing the stacked strips. Gate structures are formed by forming gate electrode stacks within the recesses and disposed on the stacked strips.

In some embodiments of the present disclosure, a method for forming a fin-type field effect transistor is described. A substrate with fins and insulators located between the fins is provided. A high-k dielectric layer and a work function metal material layer are sequentially formed on the insulators and the fins and over the substrate. A polysilicon layer and a hard mask pattern are sequentially formed on the work function metal material layer and over the substrate. Polysilicon strips are formed by patterning the polysilicon layer using the hard mask pattern as a mask. Work function metal material strips and high-k dielectric strips are formed by patterning the high-k dielectric layer and the work function metal material layer sequentially using the polysilicon strips and the hard mask pattern as masks. Spacers are formed beside the polysilicon strips and beside the high-k dielectric strips and the work function metal material strips. The polysilicon strips are removed to form recesses exposing the high-k dielectric strips and the work function metal material strips. Gate structures are formed by forming gate electrode stacks within the recesses and on the high-k dielectric strips and the work function metal material strips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-type field effect transistor, comprising:
   a substrate having fins and insulators between the fins;
   at least one gate structure, disposed over the fins and over the insulators, wherein the at least one gate structure comprises a stacked strip disposed over the substrate and a gate electrode disposed on the stacked strip;
   spacers, disposed on opposite sidewalls of the at least one gate structure;
   a material layer disposed between the stacked strip and the fins and between the spacers and the substrate;
   a dielectric layer disposed on the substrate, wherein the gate electrode at line-end portions of the at least one gate structure physically contacts inner sidewalls of the spacers and physically contacts sidewalls of the dielectric layer; and
   source and drain regions, disposed on two opposite sides of the at least one gate structure.

2. The transistor of claim 1, wherein the stacked strip comprises a high-k dielectric strip disposed on the substrate and a work function metal material strip disposed on the high-k dielectric strip, and the high-dielectric strip and the work function metal material strip conformally cover sidewalls and top surfaces of the fins.

3. The transistor of claim 2, wherein the high-k dielectric strip comprises a high-k dielectric material having a k value greater than about 7.0 and the high-k dielectric material includes a metal oxide or a silicate of Hf, Al, Zr, La, Mg, Ba, Ti, Pb or a combination thereof.

4. The transistor of claim 2, wherein a material of the work function metal material strip comprises TiN, TaC, TaCNO, TaCN, TiAl, TaN or a combination thereof.

5. The transistor of claim 2, wherein, the high-k dielectric strip comprises $HfO_2$ and the work function metal material strip comprises TiN.

6. The transistor of claim 1, wherein the material layer includes silicon oxide.

7. The transistor of claim 1, wherein a material of the gate electrode stack comprises Al, Cu, W, Co, Ti, Ta, Ru, TiN, TiAl, TiAlN, TaN, TaC, NiSi, CoSi or a combination thereof.

8. The transistor of claim 2, wherein, a material of the dielectric layer is different from a material of the spacers.

9. A fin-type field effect transistor, comprising:
a substrate having fins and insulators between the fins;
at least one gate structure, disposed over the fins and over the insulators, wherein the at least one gate structure comprises a high-k dielectric layer, a work function metal material layer and a gate electrode, the work function metal material layer is disposed on the high-k dielectric layer, and the gate electrode is disposed on the work function metal material layer;
spacers, disposed on opposite sidewalls of the at least one gate structure, wherein the gate electrode, the work function metal material layer and the high-k dielectric layer are in direct contact with inner sidewalls of the spacers;
an insulation material layer disposed between the high-k dielectric layer and the fins and between the spacers and the substrate;
a dielectric layer disposed on the substrate, wherein a material of the dielectric layer is different from a material of the spacers, and the gate electrode, the work function metal material layer and the high-k dielectric layer are in direct contact with sidewalls of the dielectric layer; and
source and drain regions, disposed on two opposite sides of the at least one gate structure.

10. The transistor of claim 9, wherein the material of the spacers includes silicon nitride, SiCON or the combination thereof, and the material of the dielectric layer includes carbon-containing oxides, silicate glass, or other dielectric materials.

11. The transistor of claim 9, wherein the high-k dielectric layer comprises a high-k dielectric material having a k value greater than about 7.0 and the high-k dielectric material includes a metal oxide or a silicate of Hf, Al, Zr, La, Mg, Ba, Ti, Pb or a combination thereof.

12. The transistor of claim 9, wherein a material of the work function metal material layer comprises TiN, TaC, TaCNO, TaCN, TiAl, TaN or a combination thereof.

13. The transistor of claim 9, wherein, the high-k dielectric layer comprises $HfO_2$ and the work function metal material layer comprises TiN.

14. The transistor of claim 9, wherein the insulation material layer includes silicon oxide.

15. The transistor of claim 9, wherein a material of the gate electrode comprises Al, Cu, W, Co, Ti, Ta, Ru, TiN, TiAl, TiAlN, TaN, TaC, NiSi, CoSi or a combination thereof.

16. A method for forming a fin-type field effect transistor, comprising:
providing a substrate with fins and insulators located between the fins;
forming an insulation material layer conformally covering the fins and on the substrate;
forming a high-k dielectric layer and a work function metal material layer sequentially on the insulators and over the fins and over the substrate;
forming a polysilicon layer and a hard mask pattern sequentially on the work function metal material layer and over the substrate;
forming polysilicon strips by patterning the polysilicon layer using the hard mask pattern as a mask;
forming work function metal material strips and high-k dielectric strips by patterning the work function metal material layer and the high-k dielectric layer sequentially using the polysilicon strips and the hard mask pattern as masks;
forming spacers beside the polysilicon strips, beside the high-k dielectric strips and the work function metal material strips and on the insulation material layer and removing the hard mask pattern during forming the spacers;
forming an inter-dielectric layer over the substrate and abutting the polysilicon strips, the work function metal material strips and high-k dielectric strips after forming the spacers;
removing the polysilicon strips to form recesses exposing the inter-dielectric layer and the work function metal material strips; and
forming gate structures by forming gate electrode stacks filling the recesses and on the work function metal material strips and the high-k dielectric strips.

17. The method of claim 16, wherein forming the high-k dielectric layer comprises performing atomic layer deposition (ALD), molecular beam deposition (MBD) or physical vapor deposition (PVD), the high-k dielectric layer is formed of a high-k dielectric materials having a k value greater than about 7.0 and the high-k dielectric material includes a metal oxide or a silicate of Hf, Al, Zr, La, Mg, Ba, Ti, Pb or a combinations thereof.

18. The method of claim 16, wherein forming the work function metal material layer comprises performing ALD, PVD or chemical vapor deposition (CVD) and a material of the work function metal material layer includes TiN, TaC, TaCNO, TaCN, TiAl, TaN or a combination thereof.

19. The method of claim 16, wherein the insulation material layer is formed by thermal oxidation.

20. The method of claim 16, wherein forming the work function metal material strips and high-k dielectric strips comprises performing at least one anisotropic etching process to remove portions of the work function metal material layer and the high-k dielectric layer.

* * * * *